United States Patent [19]

Dyment

[11] 3,955,082
[45] May 4, 1976

[54] PHOTODIODE DETECTOR WITH SELECTIVE FREQUENCY RESPONSE

[75] Inventor: John Cameron Dyment, Kanata, Canada

[73] Assignee: Northern Electric Company Limited, Montreal, Canada

[22] Filed: Sept. 19, 1974

[21] Appl. No.: 507,455

[52] U.S. Cl. ................................. 250/211 J; 357/30
[51] Int. Cl.² ........................................ H01J 39/12
[58] Field of Search ............. 250/211 R, 211 J, 208, 250/209; 357/30, 31

[56] References Cited
UNITED STATES PATENTS

| | | | |
|---|---|---|---|
| 3,443,102 | 5/1969 | Kaye | 250/211 J |
| 3,478,214 | 11/1969 | Dillman | 250/211 J |
| 3,617,753 | 11/1971 | Kato et al. | 357/30 |
| 3,638,026 | 1/1972 | Scott et al. | 357/30 |
| 3,828,231 | 8/1974 | Yamamoto | 357/30 |
| 3,840,740 | 10/1974 | Stewart | 250/211 J |
| 3,845,295 | 10/1974 | Williams et al. | 250/208 |

*Primary Examiner*—Alfred E. Smith
*Assistant Examiner*—D. C. Nelms
*Attorney, Agent, or Firm*—Sidney T. Jelly

[57] ABSTRACT

A photodiode detector comprises a substrate on which a plurality of detector sections are formed, in series. Reverse bias is applied to the separate sections, the bias more negative for each section from the input end. The absorption bandwidth for each section can vary and the bandwidth of a section can be variable.

5 Claims, 5 Drawing Figures

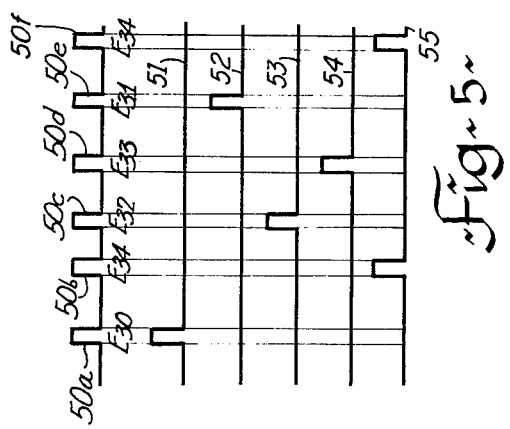
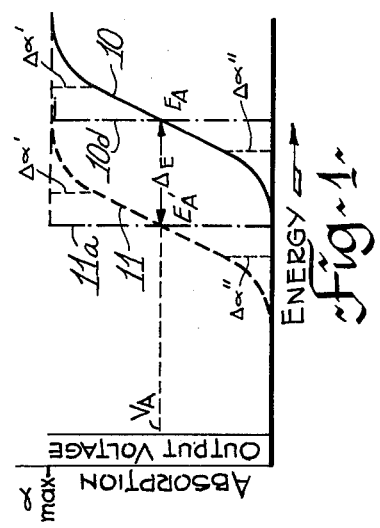
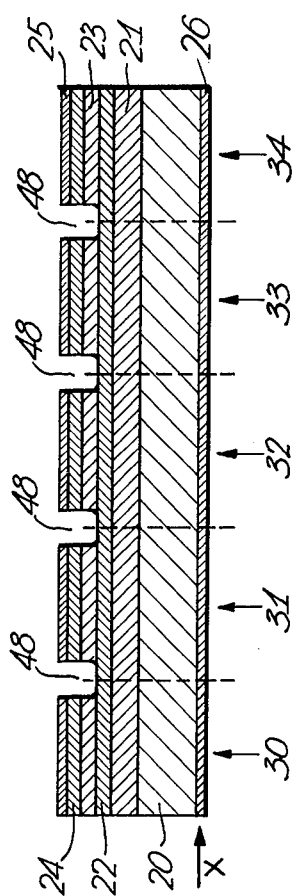
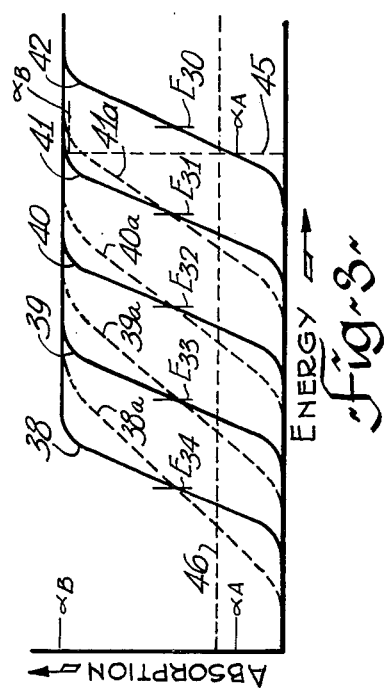
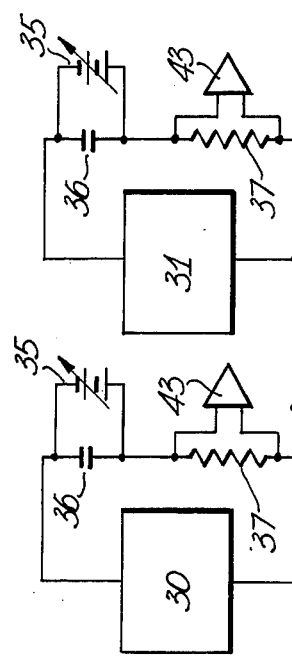

PHOTODIODE DETECTOR WITH SELECTIVE FREQUENCY RESPONSE

This invention relates to photodiode detectors with selective frequency response.

In most photodiode detectors, a beam of light impinges on the diode in a direction perpendicular to the junction plane. Those photon energies greater than the bandgap energy of the detector are absorbed within a short distance below the surface of the detector, thereby creating electron-hole pairs. Those carriers which are collected by the junction are registered as a current in the external electrical circuit. The efficient collection of carriers is optimized by placing the junction at a depth approximately equal to the penetration depth of the photons, and by operating the diode in reverse bias. A conventional diode detector responds to a broad spectrum of photon energies provided these are greater than the detector bandgap energy.

The present invention provides a photodiode detector which has certain advantages over conventional photodiode detectors. A detector, in accordance with the present invention, has separate sections, each section generally absorbing photons in a certain, predetermined energy range. The output signal from a particular section will correspond to photons within this energy range. The width of the range can be varied, and can be controlled. The light is coupled to the detector along the junction plane so that the absorbed photons will always be close to the junction and the collection efficiency is improved.

The invention will be readily understood by the following description of the embodiment, by way of example, in conjunction with the accompanying drawings, in which:

FIG. 1 is a schematic diagram illustrating shifting of band edge with application of reverse bias;

FIG. 2 is a diagrammatic cross-section through a detector in accordance with the present invention;

FIG. 3 is a series of curves illustrating the energy bands of the device of FIG. 2;

FIG. 4 illustrates diagrammatically the reverse biasing of two sections of a device as in FIG. 2;

FIG. 5 illustrates an application of a device as in FIG. 2.

Considering a double heterostructure device, in the waveguide region the absorption edge will normally be of the form indicated by curve 10 in FIG. 1. The energy $E_A$ will be determined by the basic structure of the material but will be about 1.4eV for GaAs at room temperature. Applying a reverse bias shifts the absorption edge as shown by curve 11. The amount of shift will depend upon the magnitude of the reverse bias $V_R$.

If the absorption edges were vertical, for example as indicated by the chain dotted lines 10a and 11a, then the structure would absorb all photons with energies above $E_A$ and $E'_A$ with the absorption efficiency being $\alpha$ max. However, as is well known the absorption edge is not vertical but is inclined as in curves 10 and 11. Thus there is some increase in absorption above zero ($\Delta\alpha''$) at energies below $E_A$ and $E'_A$, and some decrease in the absorption from $\alpha$ max ($\Delta\alpha'$) at energies above $E_A$ and $E'_A$. These changes in absorption (i.e. $\Delta\alpha''$ and $\Delta\alpha'$) are small effects compared to $\alpha$ max. For the purposes of subsequent discussion it is assumed that the absorption edges are vertical — as indicated by lines 10a and 11a — although the true situation, as indicated by lines 10 and 11, is appreciated.

FIG. 2 illustrates a photodetector device which takes advantage of the ability to shift, or position, the absorption edge by reverse bias, to provide a detector which can give signals indicative generally of different levels of energy and which can also vary the bandwidth for the different levels of energy.

The structure of the device of FIG. 2 is a double heterostructure comprising a substrate 20 on one surface of which are grown epitaxial layers 21, 22, 23 and 24. The layer 21 is a confining layer and is of the same doping type as substrate 20, for example $n$ type. The layer 21 is of GaAlAs. Layer 22 is the active, or waveguide layer, is of doping type $n$, and is of GaAs, to which a small amount of aluminum — typically less than 10% can be added. Layer 23 is a further confining layer, of a doping type opposite to that of layer 22, and is of GaAlAs. Layer 24 is a capping layer, of the same doping type as layer 23 and is of GaAs. On layer 24 is formed a metal contact layer 25 and a metal contact layer 26 is also formed on the other surface of the substrate 20.

Following growing of layers 21, 22, 23 and 24, formation of layers 25 and 26, the structure is etched to define a number of electrically isolated sections, indicated at 30, 31, 32, 33 and 34. A reverse voltage bias is applied to each section with the high numbered sections being biased successively more negative. Light enters the waveguide, or active layer 22 in the direction of the arrow X.

Each section will generally detect photons which are absorbed in that particular section. FIG. 3 illustrates the energy bands for the device of FIG. 2, the curves 38 to 42 illustrating the upper energy edges for sections 34 to 30 respectively. As described in conjunction with FIG. 1, as the absorption edges are inclined, there is some absorption of energies below a particular value and some non-absorption of energies above a particular value.

The output from a detector will depend upon the magnitude of $\alpha$ — the absorption coefficient. If $\alpha$ is high — which means a large amount of absorbed light — the photocurrent will be high also. Relating to FIG. 1 the output voltage generated by this photocurrent across a resistor in the circuit will be a maximum when $\alpha = \alpha$ max. The photocurrent, or output voltage will have a curve which effectively has the same qualitative behaviour as FIG. 1. Thus the output voltages can be indicated on FIG. 1. Thus, at an energy of $E_A$ there is an output voltage of $V_A$. If it is desired to have the detector respond only to $E > E_A$ for example, then it is necessary to provide a circuit which will only respond to an output voltage $V > V_A$, and reject those values of $V < V_A$.

This is illustrated diagrammatically in FIG. 4 which shows two sections of the structure of FIG. 2, sections 30 and 31. The sections 30 and 31 are shown as separate sections, but in practice would usually be on a common substrate, as in FIG. 2. The back of each section is connected to a common source — normally ground. This would be obtained by the contact layer 26 of FIG. 2. Each section is reverse biased by a circuit including a bias voltage supply indicated at 35. This can be made variable, as shown. The bias voltage may be applied in parallel with a condenser 36. The bias voltage supply 35, and condenser 36, are connected to the common source — ground — in series with a resistor 37 across which is an amplifier 43 connected in parallel with resistor 37. The amplifier 43 is arranged, in a known manner, to pass an output signal or pulse only when the potential across the resistor 37 exceeds a predetermined voltage. The reverse bias is increased for each section, in equal steps, or non-equal steps as will be described.

Referring to FIGS. 2 and 3, consider a light pulse of energy $E < E_{30}$ but $E > E_{31}$ as indicated on FIG. 3 at 45. Curve 42 is the absorption edge for section 30 and curve 41 is the absorption edge for section 31. For section 30 the absorption coefficient is only $\alpha_A$, which will produce only a small output voltage in section 30.

For section 31, the absorption coefficient is $\alpha_B$ and is very high. Therefore the corresponding output voltage V is high. By arranging that the amplifier 38 will be triggered only when a voltage exceeds the valve corresponding to the absorption efficiency indicated by dotted line 46, section 31 will indicate detection of the energy pulse and section 30 will not. The line 46 can be set at any desired level. The line 45 is presented only as an indication of a particular value of E for purposes of description and can vary.

By providing means for varying the bias applied to any section it is possible to vary the absorption band width of that section. It is possible to provide control of the bias applied to each section so that it would be possible to select a particular limited range of energy and use two, three or four sections to operate within this range — giving a more detailed detection, for example, the remainder of the light input being detected by the remaining section or sections. Thus instead of the curves in FIG. 3 being evenly spaced they can be given variable effective spacing.

A further variation which needs taking into consideration is that the slopes of the curves indicating the absorption edges become less steep as the reverse bias increases. As illustrated in FIG. 3, the curves 38, 39, 40, 41 and 42 are shown as having the same slope. In practice the slopes will vary, somewhat as illustrated by the dotted curves 38a, 39a, 40a and 41a. To maintain an effective equal bandwidth it would be necessary to increment the reverse bias by increasing amounts for the higher numbered sections. If a variable effective spacing is required, as described above, then additional variation of the reverse bias will be necessary. As an alternative to increasing the reverse bias to offset the effect of variation in slope the section can be increased in length, i.e. section 34 longer than section 33 which is longer than section 32, and so on.

The structure of FIG. 2 is useful as a demultiplexing device, and enables the sorting out of complex digital optical pulses. FIG. 5 illustrates the application, with a series of multiplexed optical signals being indicated at 50a – 50f. The energy of the various pulses will differ and indicated below each of the optical signals is the related energy value with reference to a particular section of the structure. Thus pulse 50a is of an energy value which will be absorbed by section 30, pulse 50b by section 34, 50c by section 32, 50d by section 33, 50e by section 31 and 50f by section 34. The outputs from the sections are indicated at 51 to 55 for sections 30 to 34 respectively.

While the pulses are shown as separated in time this is not essential. Pulses of differing energy values can be coincident in time and the various sections will absorb the pulses and produce output signals.

The layers 21, 22, 23 and 24 are sequentially grown by liquid phase epitaxy, by well known techniques. Typical examples of processes and apparatus for growing layers sequentially are described in "Preparation of GaAs p-n Junctions" by B. I. Miller and H. C. Casey Jr., paper 24, 1972 Symposium on GaAs; and in Canadian Pat. No. 902,803 issued June 13, 1972.

In one form of apparatus substrate wafers are positioned in a carbon slider which moves sequentially beneath reservoirs containing epitaxy solution. At each reservoir, substrate and solution are cooled to cause epitaxial growth. At the end of the growing process, the substrates are finally cooled and cleaned.

The following table illustrates the characteristics of the various layers and the dopant concentrations in milligrams per 4 gm melt.

| Layer | Type | Al | Te | Ge | Thickness($\mu$m) | Carrier Concentration |
|---|---|---|---|---|---|---|
| 21 | n-Ga$_{0.65}$Al$_{0.35}$As | 6 | 2 | — | $\simeq$ 3 | $\geq 5 \times 10^{17}$cm$^{-3}$ |
| 22 | n-Ga$_{0.95}$Al$_{0.05}$As | 1 | Sn 20 mg | — | $\leq$ 1 | $\leq 2 \times 10^{16}$cm$^{-3}$ |
| 23 | p-Ga$_{0.65}$Al$_{0.35}$As | 7 | — | 120 | $\geq$ 1 | $\geq 5 \times 10^{17}$cm$^{-3}$ |
| 24 | p-GaAs | — | — | 40 | $\simeq$ 1.5 | $\simeq 10^{18}$cm$^{-3}$ |

In some cases, an amount of GaP is added to layers 21 and 23. The amount in the melt is 100$\mu$g/4gm and results in a general layer of the form Ga$_{0.65}$Al$_{0.35}$As$_{1-y}$P$_y$ where y is estimated to be less than 0.02. The incorporation of P causes a reduction in strain at the interfaces between layers 21 and 22 and between layers 22 and 23.

The thicknesses of the layers 21 and 23 are not critical but are preferably $\geq$ 1.0 $\mu$m in order that good waveguiding properties exist. Layer 22 should be about 1.0 $\mu$m but can be thinner. The doping levels in the various layers are reasonably critical. In general, layers 21 and 23 should have more than an order of magnitude higher doping than layer 22. This ensures that most of the applied electric field will appear across layer 22 where it is required to affect the light in the waveguide. At carrier concentrations of $2 \times 10^{16}$cm$^{-3}$, the 1.0 $\mu$m thickness for layer 22 will be entirely depleted of free carriers even at zero bias (that is, the depletion width is approximately 1 $\mu$m for carrier concentrations $\simeq 2 \times 10^{16}$cm$^{-3}$). Thus the doping level and thickness of layer 22 are resonably critical to obtain the optimum device performance. Larger layer 22 thickness will result in less efficient coupling of the light to the electric field whereas values smaller than 1 $\mu$m will present some increased complexity in coupling light into the narrower waveguide.

Layer 24 is an optional layer and devices will operate satisfactorily without this layer.

Normally a plurality of devices will be fabricated simultaneously on a substrate. The fabrication steps for making devices as described above are as follows, after growing the four layers 21, 22, 23 and 24 as described, layer 22 of n type to provide adequate electrical isolation.

a. diffuse Zn into layer 24, using AnAs$_2$ source in a nitrogen atmosphere for 15 minutes at 600°C;

b. evaporate 2000A of Au on layer 24, holding substrate at 200°C during evaporation;

c. lap n-GaAs substrate to thickness of about 100 μm;

d. clean and evaporate Au (12% Ge) to thickness of 4000A on lapped surface with substrate at 200°C;

e. alloy at 450°C for 3 minutes in nitrogen atmosphere — to form n contact 26;

f. photoengrave a pattern on heterostructure side of structure to define stripes — to form isolation grooves 48 — FIG. 2 — typically the stripes 50 μm wide on 500 μm centres and aligned with cleavage edge of substrate;

g. remove Au layer 25 at stripes using etch KI:I$_2$:H$_2$O (275g:15g:250g:) for 30 seconds to 60 seconds at room temperature; (shorter etch times are requested at 750°C);

h. etch layer 24 away at stripes using H$_2$O$_2$:NH$_4$OH (approximately 700:1 to provide pH = 7.0) with agitation until layer 24 is removed. Typical etch rates are 0.1 μm/min. This preferentially removes layer 24 but not layer 23 which has a much higher Al content;

i. etch layer 23 using concentrated HF. Typical etch times are 10 minutes to remove 1 μm. This preferentially removes layer 23 but not layer 22 which has a low Al content;

j. cleave out devices which have the required number of sections — typically 4 or 5 sections. Overall device length for 5 sections is approximately 2.5mm and width is typically 0.25mm.

An alternative for step (i) is to use a KI:I$_2$:H$_2$O (275g:15g:250g) etch at 75°C — as is used in step (g). Typical etch times of 15 to 30 seconds will remove 1 to 2 μ of p-GaAlAs.

To reduce the device capacitance by approximately a factor of 10X, which would decrease the response time, a stripe contact could be formed. Such stripe contacts could be formed by proton bombardment. This can be accomplished after step (i). An array of parallel wires, typically 25μm diameter at 250 μm centres, is positioned over the structure, the wires perpendicular to the cleavage edge and the etched grooves. The structure is bombarded with protons of energy 300–400 keV at desage of $3 \times 10^{15}$cm$^{-2}$. The protons create high resistivity material from the surface to a depth exceeding the junction, but only in the areas between wires. Low resistivity material occurs under the wires. The result of bombardment will be a lowering of the device capacitance by approximately a factor of 10X and this will decrease response time of the detector. A typical proton bombardment process is described in "Proton Bombardment Formation of Stripe-Geometry Heterostructure Lasers for 300K CW Operation", by J. D. Dyment, L. A. D'Asaro, J. C. North, B. I. Miller and J. E. Ripper, Proceedings of the IEEE., Vol. 60, No. 6, June 1972 pp 726–728.

A further modification is to evaporate an antireflection coating on the input end of each device to improve coupling efficiency.

As described the active or waveguide layer 22 is of the same doping type as the substrate 20 and confining layer 21 and opposite to layers 23 and 24. As an example, substrate 20 and layers 21 and 22 have been described as n-type and layers 23 and 24 of p-type. This can be reversed, substrate 20 and layers 21 and 22 of p-type and layers 23 and 24 of n-type.

Also instead of obtaining electrical isolation by etching grooves or slots, it is possible to obtain isolation by other methods, including doping on proton bombardment.

What is claimed is:

1. A photodiode detector, comprising:
    a substrate;
    a multilayer structure on a surface of said substrate, said structure comprising a plurality of aligned detector sections;
    said structure comprising a confining layer on said surface of said substrate and an active layer on said confining layer, said confining layer and said active layer of the same conductivity type and extending homogeneously across said substrate for all the detector sections;
    said active laye providing a waveguide layer having a portion for each detector with said portions in optical alignment, the active layer having an input end;
    a further confining layer on said active layer, said further confining layer of a conductivity type opposite to that of said active layer and separated into portions, a portion for each detector section, the portions of said further confining layer electrically isolated from each other;
    means for applying a reverse bias to each detector section, the bias successively more negative for each successive section from said input end;
    output means for each section for producing an output signal indicative of photon absorption in said section.

2. A detector as claimed in claim 1, including means for varying the reverse bias applied to each section.

3. A detector as claimed in claim 1, said output means for each section comprising circuit means for producing an output signal when an input signal to said circuit means exceeds a predetermined value.

4. A detector as claimed in claim 1, comprising a doped gallium arsenide substrate, a doped gallium aluminum arsenide confining layer on said substrate and of the same conductivity type as said substrate;
    a doped gallium aluminum arsenide active layer on said confining layer of the same conductivity type as said confining layer and of a lower doping level than said confining layer;
    a further confining layer of gallium arsenide on said active layer of the opposite conductivity type to said active layer and of a higher doping level than said active layer.

5. A detector as claimed in claim 4, including a capping layer of gallium arsenide on said further confining layer of the same conductivity type as said further confining layer and of a higher doping level than said further confining layer.

* * * * *